(12) United States Patent
Hsiao et al.

(10) Patent No.: US 11,690,183 B2
(45) Date of Patent: Jun. 27, 2023

(54) SUPPORTING ASSEMBLY

(71) Applicants: Inventec (Pudong) Technology Corporation, Shanghai (CN); INVENTEC CORPORATION, Taipei (TW)

(72) Inventors: Chi-Cheng Hsiao, Taipei (TW); Ying-Chao Peng, Taipei (TW); Chun-Ying Yang, Taipei (TW)

(73) Assignees: INVENTED (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 158 days.

(21) Appl. No.: 17/346,585

(22) Filed: Jun. 14, 2021

(65) Prior Publication Data
US 2022/0159850 A1 May 19, 2022

(30) Foreign Application Priority Data
Nov. 16, 2020 (CN) .......................... 202011279205.X

(51) Int. Cl.
*H05K 5/00* (2006.01)
*B60R 16/023* (2006.01)

(52) U.S. Cl.
CPC ....... *H05K 5/0073* (2013.01); *B60R 16/0239* (2013.01)

(58) Field of Classification Search
CPC ... H05K 5/0073; B60R 16/0239; G06F 1/181; F16F 15/08
See application file for complete search history.

(56) References Cited

FOREIGN PATENT DOCUMENTS

CN 106856650 A * 6/2017 ............. B60R 16/02

* cited by examiner

Primary Examiner — Jacob M Amick
Assistant Examiner — Charles J Brauch
(74) Attorney, Agent, or Firm — Locke Lord LLP; Tim Tingkang Xia, Esq.

(57) ABSTRACT

A supporting assembly configured to fix chassis of electronic device to fixing bracket. Supporting assembly includes plate body, cushion, fastener and spacer. Plate body includes mounting hole and wall surface forming mounting hole, and plate body is configured to be fixed to chassis of electronic device. Cushion is disposed through mounting hole and includes opening. Fastener is disposed through opening of cushion. A side of fastener is configured to be fixed to fixing bracket, and cushion is clamped between another side of fastener and fixing bracket so as to be compressed. Spacer is disposed in mounting hole and located between wall surface of plate body and cushion. Hardness of spacer is greater than hardness of cushion.

9 Claims, 3 Drawing Sheets

SUPPORTING ASSEMBLY

CROSS-REFERENCE TO RELATED APPLICATIONS

This non-provisional application claims priority under 35 U.S.C. § 119(a) on Patent Application No(s). 202011279205.X filed in China, on Nov. 16, 2020, the entire contents of which are hereby incorporated by reference.

BACKGROUND OF THE INVENTION

Technical Field of the Invention

The invention relates to a supporting assembly, more particularly to a supporting assembly including a spacer.

Description of the Related Art

In general, an automotive computer or automotive server is fixed on a supporting plate, and the supporting plate is fixed to the bodyshell via screws, where the screws are disposed through mounting holes on the supporting plate and screwed into screw holes on the bodyshell. In this way, when the vehicle passes over a bump or recess on the road, the bodyshell may vibrate, and the vibration may be transferred from the bodyshell to the automotive computer or automotive server via the screw and the supporting plate. Accordingly, a cushion surrounding the screw is usually disposed in the mounting hole of the supporting plate, and can absorb the vibration transferred to the screw, thereby preventing such vibration from being further transferred to the automotive computer or automotive server.

However, the supporting plate is usually made of hard material (e.g., metal), and the cushion is in direct contact with a sharp edge of the supporting plate forming the mounting hole. Thus, in a case that the vibration continuously happens on the supporting plate, the cushion may be cut open by such sharp edge of the supporting plate. Alternatively, when the cushion absorbs a powerful vibration due to the significant velocity variation of the vehicle (sudden brake or sudden acceleration), the cushion may also be cut open by such sharp edge of the supporting plate. Therefore, the cushion may be broken by the sharp edge of the supporting plate, thereby causing the cushion to be unable to prevent the vibration from being transferred to the automotive computer or automotive server.

SUMMARY OF THE INVENTION

The invention is to provide a supporting assembly to prevent the cushion from being cut open by the plate body.

One embodiment of this invention provides a supporting assembly configured to fix a chassis of an electronic device to a fixing bracket. The supporting assembly includes a plate body, a cushion, a fastener and a spacer. The plate body includes a mounting hole and a wall surface forming the mounting hole, and the plate body is configured to be fixed to the chassis of the electronic device. The cushion is disposed through the mounting hole and includes an opening. The fastener is disposed through the opening of the cushion. A side of the fastener is configured to be fixed to the fixing bracket, and the cushion is clamped between another side of the fastener and the fixing bracket so as to be compressed. The spacer is disposed in the mounting hole and located between the wall surface of the plate body and the cushion. A hardness of the spacer is greater than a hardness of the cushion.

According to the supporting assembly disclosed by the above embodiments, the spacer is located between the wall surface of the plate body and the cushion, and the hardness of the spacer is greater than the hardness of the cushion. Thus, when the fixing bracket vibrates, the vibration is directly transferred from the plate body to the spacer instead of the cushion, such that the spacer can prevent the cushion from being cut open, thereby ensuring that the cushion can effectively absorb vibrations transferred from the fixing bracket.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
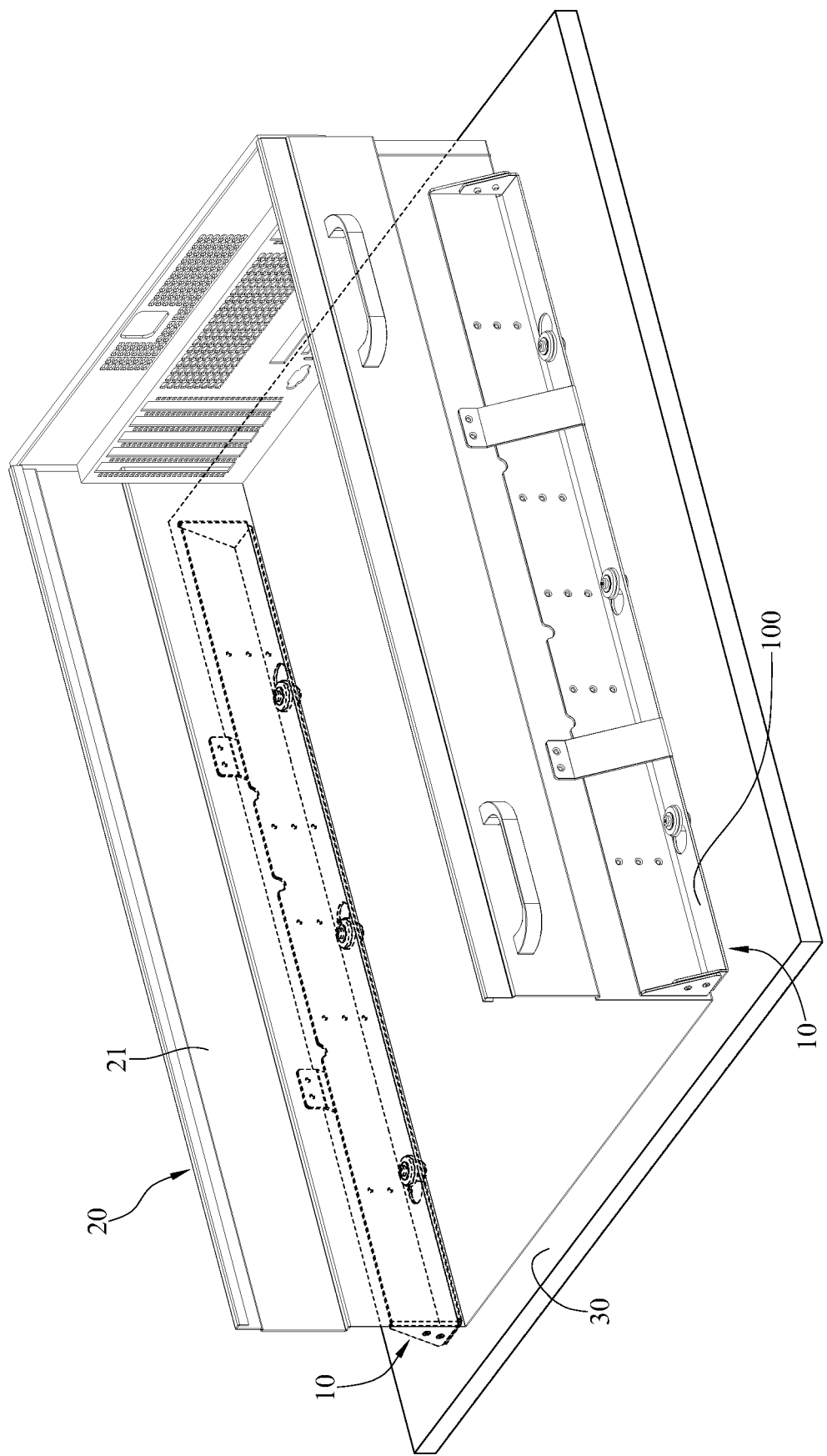
FIG. 1 is a perspective view of two supporting assemblies according to an embodiment of the invention, a fixing bracket and a chassis of an electronic device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
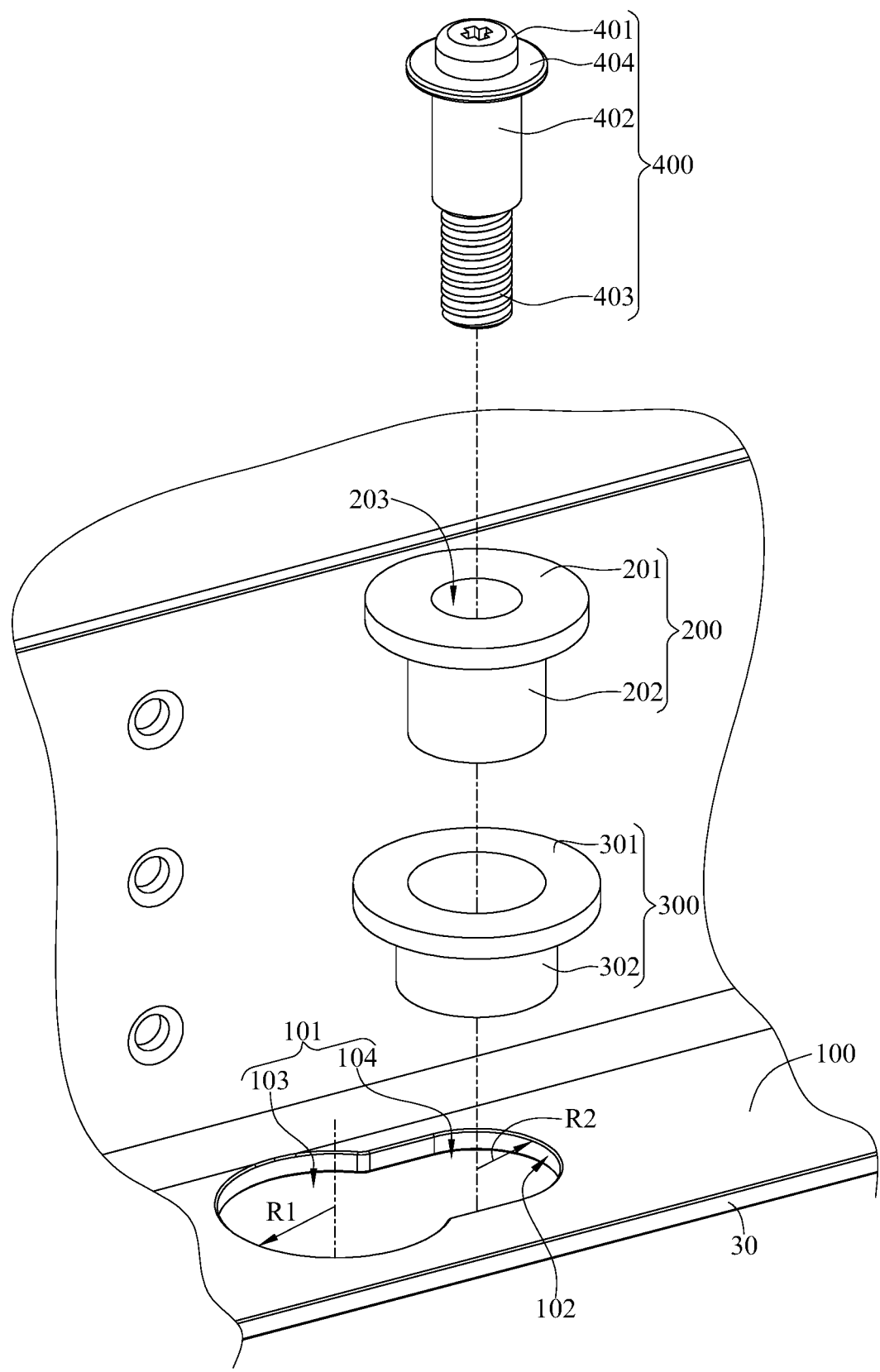
FIG. 2 is an exploded view of one supporting assembly, the fixing bracket and the chassis of the electronic device shown in FIG. 1.
Figure 3:
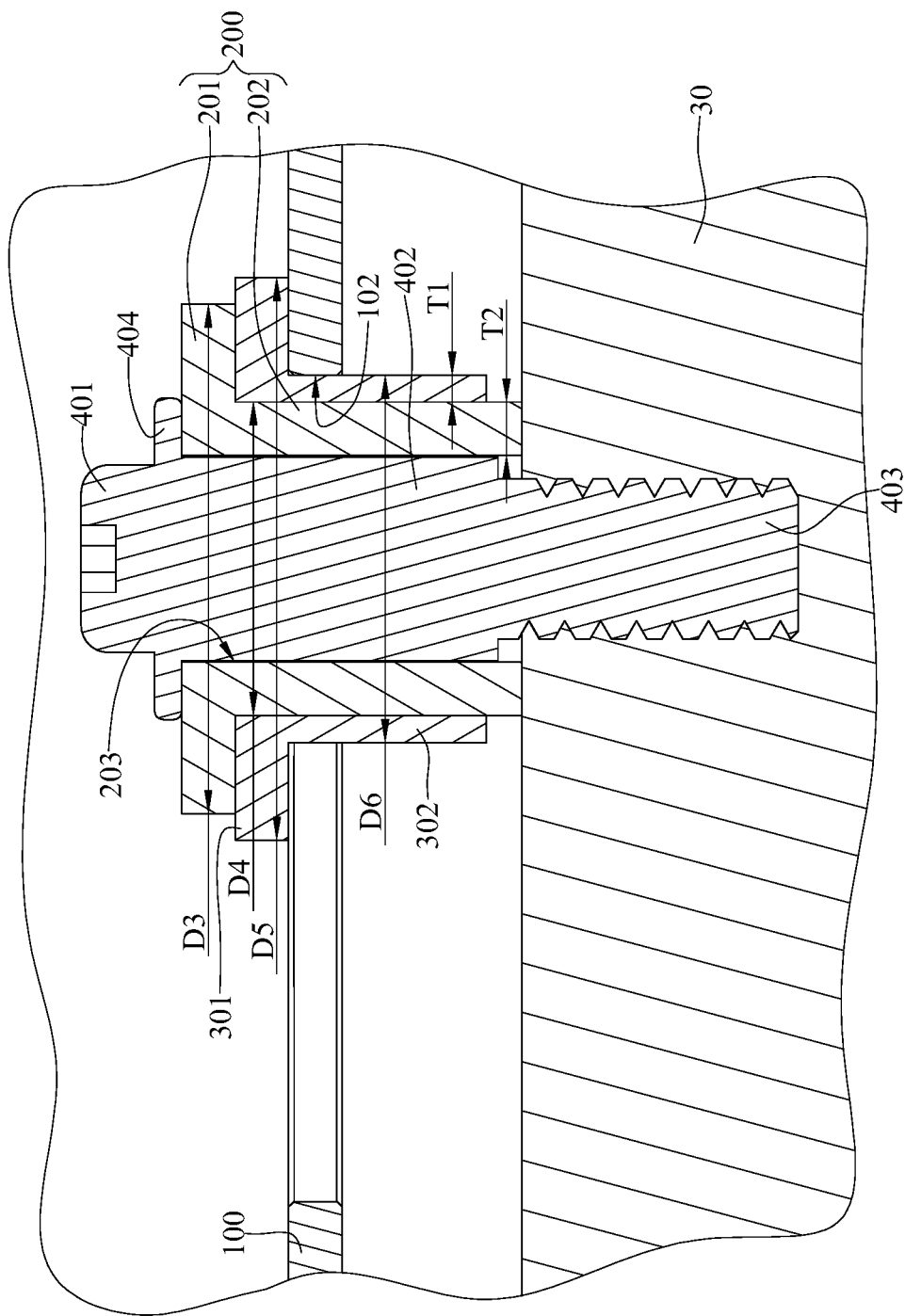
FIG. 3 is a partially enlarged side cross-sectional view of one supporting assembly, the fixing bracket and the chassis of the electronic device shown in FIG. 1.

Please refer to FIGS. 1 to 3, where FIG. 1 is a perspective view of two supporting assemblies 10 according to an embodiment of the invention, a fixing bracket 30 and a chassis 21 of an electronic device 20, FIG. 2 is an exploded view of one supporting assembly 10, the fixing bracket 30 and the chassis 21 of the electronic device 20 shown in FIG. 1, and FIG. 3 is a partially enlarged side cross-sectional view of one supporting assembly 10, the fixing bracket 30 and the chassis 21 of the electronic device 20 shown in FIG. 1.

In this embodiment, the two supporting assemblies 10 are respectively configured to be disposed on two opposite sides of the chassis 21 of the electronic device 20. The electronic device 20 is, for example, an automotive computer. It is noted that, in other embodiments, there may merely be one supporting assembly, and such supporting assembly may be disposed on a side of the chassis of the electronic device, or the two supporting assemblies may be connected to each other and thus be integrated as one body. In addition, since the two supporting assemblies 10 are similar in structure, only one supporting assembly 10 will be described in detail hereinafter.

In this embodiment, the supporting assembly 10 includes a plate body 100, a plurality of cushions 200, a plurality of fasteners 400 and a plurality of spacers 300. Note that in other embodiments, the supporting assembly may merely include one cushion, one fastener and one spacer. For example, the plate body 100 is disposed on a fixing bracket 30 that is located in a rear compartment of a vehicle, and the electronic device 20 is disposed on the fixing bracket 30 via the supporting assembly 10. The plate body 100 includes a plurality of mounting holes 101 and a plurality of wall surfaces 102 respectively forming the mounting holes 101. In embodiments where the supporting assembly merely includes one cushion, one fastener and one spacer, the plate body may merely include one mounting hole and one wall surface. The plate body 100 is configured to be fixed on the chassis 21 of the electronic device 20. As shown in FIG. 2, in this embodiment, the mounting holes 101 are, for example, gourd holes. Specifically, as shown in FIG. 2, the mounting hole 101 includes a wider portion 103 and a narrower portion 104, and a radius R1 of the wider portion 103 is greater than a radius R2 of the narrower portion 104. In other embodiments, the mounting holes may be circular holes.

Please refer to FIGS. 2 and 3. In this embodiment, the cushion 200 includes a first head part 201 and a first neck part 202 that are connected to each other. The cushion 200 is made of, for example, rubber. A diameter D3 of the first head part 201 is greater than a diameter D4 of the first neck part 202. The first neck part 202 is disposed through the narrower portion 104 of the mounting hole 101. The first head part 201 and the first neck part 202 together form an opening 203. Specifically, the opening 203 penetrates through the first head part 201 and the first neck part 202.

Please refer to FIGS. 2 and 3. In this embodiment, the spacer 300 is made of, for example, plastic, and a hardness of the spacer 300 is greater than a hardness of the cushion 200. In addition, in this embodiment, the hardness of the spacer 300 is smaller than a hardness of the plate body 100, but the disclosure is not limited thereto. In other embodiments, the hardness of the spacer may be greater than or equal to the hardness of the plate body. Further, in this embodiment, the spacer 300 includes a second head part 301 and a second neck part 302 that are connected to each other. A diameter D5 of the second head part 301 is greater than a diameter D6 of the second neck part 302. The second head part 301 is clamped between the first head part 201 and the plate body 100. The second neck part 302 is disposed through the mounting hole 101 and is clamped between the first neck part 202 and the wall surface 102 of the plate body 100. Additionally, in this embodiment, a radial thickness T1 of the second neck part 302 is smaller than a radial thickness T2 of the first neck part 202, but the disclosure is not limited thereto. In other embodiments, the radial thickness of the second neck part may be greater than or equal to the radial thickness of the first neck part.

Please refer to FIGS. 2 and 3. In this embodiment, the fastener 400 includes a head part 401, a body part 402, a thread part 403 and a flange part 404. The head part 401 is connected to the thread part 403 via the body part 402. That is, two opposite sides of the body part 402 are respectively connected to the head part 401 and the thread part 403. The flange part 404 radially protrudes from an end of the head part 401 that is located close to the body part 402. The body part 402 is disposed through the opening 203 of the cushion 200. The thread part 403 is screwed into the fixing bracket 30, and the cushion 200 is clamped between the flange part 404 and the fixing bracket 30 so as to be compressed. In other embodiments, the fastener may not include the body part, and the thread part may be directly connected to the head part. In such embodiments, the thread part may be disposed through the opening of the cushion. In still other embodiments, the fastener may not include the flange part.

Note that in other embodiments, the spacer may not include the second head part, and in such embodiments, the first head part of the cushion may rest on the plate body. Alternatively, in still other embodiments, beside that the spacer does not include the second head part, the cushion may not include the first head part. Also, in such embodiments, the fastener may rest on the spacer and the plate body via the first neck part of the cushion.

Furthermore, in other embodiments, the spacer may not be clamped between the wall surface of the plate body and the cushion and may merely be located between the wall surface of the plate body and the cushion. That is, in other embodiments, as long as the spacer is located between the wall surface of the plate body and the cushion, the spacer may not be in direct contact with the wall surface and the cushion.

According to the supporting assembly disclosed by the above embodiments, the spacer is located between the wall surface of the plate body and the cushion, and the hardness of the spacer is greater than the hardness of the cushion. Thus, when the fixing bracket vibrates, the vibration is directly transferred from the plate body to the spacer instead of the cushion, such that the spacer can prevent the cushion from being cut open, thereby ensuring that the cushion can effectively absorb vibrations transferred from the fixing bracket.

In an embodiment of the invention, the supporting assembly disclosed by the invention can be applied to vehicles, such as autonomous vehicles (AV), electric vehicles, or a vehicle equipped with an advanced driver assistance systems (ADAS). In another embodiment of the invention, the supporting assembly disclosed by the invention can be applied to an automotive server that may be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A supporting assembly, configured to fix a chassis of an electronic device to a fixing bracket, the supporting assembly comprising:
   a plate body, wherein the plate body comprises a mounting hole and a wall surface forming the mounting hole, and the plate body is configured to be fixed to the chassis of the electronic device;
   a cushion, wherein the cushion is disposed through the mounting hole and comprises an opening;
   a fastener, wherein the fastener is disposed through the opening of the cushion, a side of the fastener is configured to be fixed to the fixing bracket, and the cushion is clamped between another side of the fastener and the fixing bracket so as to be compressed; and
   a spacer, wherein the spacer is disposed in the mounting hole and located between the wall surface of the plate body and the cushion;
   wherein, a hardness of the spacer is greater than a hardness of the cushion, the mounting hole comprises a wider portion and a narrower portion that are connected to each other, a radius of the wider portion is greater than a radius of the narrower portion, and the cushion is disposed through the narrower portion.

2. The supporting assembly according to claim 1, wherein the spacer is made of plastic.

3. The supporting assembly according to claim 1, wherein the hardness of the spacer is smaller than a hardness of the plate body.

4. The supporting assembly according to claim 1, wherein the cushion is made of rubber.

5. The supporting assembly according to claim 1, wherein the fastener comprises a head part, a thread part and a flange part, the head part and the thread part are connected to each other, the flange part radially protrudes from an end of the head part that is located close to the thread part, the thread part is disposed through the opening of the cushion and is screwed into the fixing bracket, and the cushion is clamped between the flange part and the fixing bracket.

6. The supporting assembly according to claim 5, wherein the fastener further comprises a body part, two opposite sides of the body part are respectively connected to the head part and the thread part, and the body part is disposed through the opening of the cushion.

7. The supporting assembly according to claim 1, wherein the cushion comprises a first head part and a first neck part that are connected to each other, a diameter of the first head part is greater than a diameter of the first neck part, the first head part rests on the plate body, and the spacer is clamped between the first neck part and the wall surface of the plate body.

8. The supporting assembly according to claim 7, wherein the spacer comprises a second head part and a second neck part that are connected to each other, a diameter of the second head part is greater than a diameter of the second neck part, the second head part of the spacer is clamped between the first head part of the cushion and the plate body, the second neck part is disposed through the mounting hole, the second neck part is clamped between the first neck part and the wall surface of the plate body.

9. The supporting assembly according to claim 8, wherein a radial thickness of the second neck part is smaller than a radial thickness of the first neck part.

* * * * *